US012804861B2

(12) United States Patent
Yhr

(10) Patent No.: US 12,804,861 B2
(45) Date of Patent: Nov. 17, 2026

(54) ECU RACK FOR USE IN A VEHICLE

(71) Applicant: VOLVO TRUCK CORPORATION, Gothenburg (SE)

(72) Inventor: Hamid Yhr, Gråbo (SE)

(73) Assignee: VOLVO TRUCK CORPORATION, Gothenburg (SE)

( * ) Notice: Subject to any disclaimer, the term of this patent is extended or adjusted under 35 U.S.C. 154(b) by 205 days.

(21) Appl. No.: 18/563,519

(22) PCT Filed: Jun. 4, 2021

(86) PCT No.: PCT/EP2021/065030
§ 371 (c)(1),
(2) Date: Nov. 22, 2023

(87) PCT Pub. No.: WO2022/253448
PCT Pub. Date: Dec. 8, 2022

(65) Prior Publication Data

US 2024/0276682 A1 Aug. 15, 2024

(51) Int. Cl.
*H05K 7/20* (2006.01)
*B60R 16/023* (2006.01)

(52) U.S. Cl.
CPC ..... *H05K 7/20872* (2013.01); *B60R 16/0231* (2013.01); *H05K 7/20236* (2013.01); *H05K 7/20627* (2013.01)

(58) Field of Classification Search
CPC .. H05K 5/06; H05K 7/20236; H05K 7/20272; H05K 7/203; H05K 7/20327;
(Continued)

(56) References Cited

U.S. PATENT DOCUMENTS 4,337,499 A * 6/1982 Cronin ................. H05K 7/1449 439/31
6,273,181 B1 * 8/2001 Matsui ................ B60R 16/0239 257/722
(Continued)

FOREIGN PATENT DOCUMENTS

CN 112566443 B * 6/2022 ......... B60H 1/00885
EP 2168792 A1 3/2010
(Continued)

OTHER PUBLICATIONS

Machine translation completed Sep. 24, 2025 for KR 20100051022-A by Bang Joon Hak (Year: 2025).*
(Continued)

*Primary Examiner* — Jayprakash N Gandhi
*Assistant Examiner* — Steven Ngo
(74) *Attorney, Agent, or Firm* — Jeffri A. Kaminski; Venable LLP

(57) ABSTRACT

An ECU rack for use in a vehicle configured for receiving a plurality of ECU modules. Each ECU module includes a fluid tight enclosure and at least one electronic connector. The ECU rack has a housing comprising a plurality of electronic connector elements and a plurality of module holding members for holding an ECU module in position in a corresponding ECU module volume. The holding members are arranged side by side to form intermediate spaces between neighbouring ECU module volumes. The ECU rack has a fluid inlet arrangement for distributing fluid to said intermediate spaces; and a fluid outlet arrangement for draining cooling fluid from said intermediate spaces wherein the ECU rack sealingly receives the enclosures, so as to fluidly seal the intermediate spaces from the electronic connectors of said ECU modules when positioned in the ECU rack.

16 Claims, 6 Drawing Sheets

(58) Field of Classification Search
CPC ........... H05K 7/20627; H05K 7/20663; H05K 7/20872; H05K 7/20881; H05K 7/20927; H05K 7/20936; H05K 2201/064; B60R 16/0231
See application file for complete search history.

(56) References Cited

U.S. PATENT DOCUMENTS

| | | | | |
|---|---|---|---|---|
| 8,913,391 | B2 * | 12/2014 | Ling | H05K 7/20545 165/185 |
| 10,070,562 | B2 * | 9/2018 | Lassini | H05K 7/20854 |
| 2002/0186534 | A1 * | 12/2002 | Sakaiya | H05K 7/20163 257/722 |
| 2003/0142481 | A1 | 7/2003 | Kinoshita et al. | |
| 2016/0347353 | A1 * | 12/2016 | Wada | B60K 6/26 |
| 2019/0230823 | A1 | 7/2019 | Korta et al. | |

FOREIGN PATENT DOCUMENTS

| | | | | |
|---|---|---|---|---|
| JP | 2005075028 | A * | 3/2005 | |
| KR | 20100051022 | A * | 5/2010 | G06F 30/15 |
| WO | 2020228928 | A1 | 11/2020 | |

OTHER PUBLICATIONS

International Search Report and Written Opinion of the International Searching Authority in corresponding International Application No. PCT/EP2021/065030 mailed Feb. 24, 2022 (14 pages).

* cited by examiner

ECU RACK FOR USE IN A VEHICLE

CROSS-REFERENCE TO RELATED APPLICATIONS

This application is a U.S. National Stage application of PCT/EP2021/065030, Jun. 4, 2021 and published on Dec. 8, 2022 as WO 2022/253448, all of which is hereby incorporated by reference in its entirety.

TECHNICAL FIELD

The present disclosure relates to an ECU rack for use in a vehicle, in particular a truck, configured for receiving a plurality of ECU modules. The disclosure also relates to an ECU arrangement, and to a vehicle comprising such an ECU rack. Also, the disclosure relates to an ECU module for use with an ECU rack.

BACKGROUND

Vehicles are provided with ECU racks, such as server racks, for receiving ECU modules to take care of the need for data processing in a vehicle. Since ECU modules develop heat when used, there is a need for cooling the ECU rack. In a vehicle, the cooling may be accomplished by conducting cooling air through the ECU rack. To this end, the ECU rack may be arranged such that the cooling air is taken from the outside of the vehicle or from the inside of the vehicle, e.g. from a vehicle cabin. In both cases, the cooling air may comprise significant amounts of contaminants such as dust, debris and salt, to which the ECU modules may be sensible.

Herein, ECU, meaning Electrical Control Unit, refers to a unit comprising electronics suitable for controlling one or more functions in a vehicle.

With "ECU module" is meant an electronic module forming part of an ECU. For example, an ECU module may comprise an electronic board or a server.

With "ECU rack" is meant herein a structure for receiving a plurality of ECU modules gathered relatively close to each other. An ECU rack may for example be a server rack. An ECU rack may for example comprise a back panel comprising electronic connector elements.

To clean the cooing air from contaminants, one or more filters may be arranged e.g. in an intake duct for cooling air leading to an ECU rack. Such filters may require regular replacement and/or cleaning.

Thus, there is a continuous need for alternatives and/or improvements relating to the cooling of ECU racks in vehicles. It is an object of the invention to provide an ECU rack fulfilling said need.

SUMMARY

The object is achieved by an ECU rack according to claim 1. Thus, there is provided an ECU rack for use in a vehicle, in particular a truck, configured for receiving a plurality of ECU modules, each ECU module comprising a fluid tight enclosure extending a length along a longitudinal axis of the ECU module and enclosing electronics of the ECU module at least along the length; and at least one electronic connector.

The ECU rack comprises a housing comprising a plurality of electronic connector elements and a plurality of module holding members, each module holding member being configured for holding an ECU module in position in a corresponding ECU module volume with an electronic connector of the ECU module connected to an electronic connector element of the ECU rack. The holding members are arranged side by side so as to form intermediate spaces between neighbouring ECU module volumes, wherein the ECU rack comprises a fluid inlet arrangement configured for receiving fluid from an exterior of the rack and for distributing the fluid to the intermediate spaces; and a fluid outlet arrangement configured for draining cooling fluid from the intermediate spaces to the exterior of the ECU rack, and wherein the ECU rack is configured for sealingly receiving the enclosures of the ECU modules when the electronic connectors of the ECU modules are coupled to the electronic connector elements, so as to fluidly seal the intermediate spaces from the electronic connectors of the ECU modules when positioned in the ECU rack.

By virtue of the sealing formed between the intermediate spaces and the electronic connectors, the sensitive parts of the ECU modules will be sealed from the flow of cooling fluid through the intermediate spaces. The sealing is formed to hinder contaminants in the cooling fluid from reaching the electronic connectors of the ECU modules or the electronic connector elements of the ECU rack. Still, efficient cooling may be accomplished by the cooling fluid flowing through the intermediate spaces formed between the ECU module volumes housing the ECU modules when the ECU rack is in use.

Thus, the cooling fluid will flow over at least a portion of the lengths of the fluid tight enclosures of the ECU modules, while the electronic connectors of the ECU modules as well as the electronic connector elements of the ECU rack are isolated from the cooling fluid by the enclosures being sealingly received by the ECU rack.

Accordingly, the ECU rack may for example be cooled using cooling fluid comprising contaminants such as dust, debris and salt, i.e. contaminants usually present in air available as cooling fluid for an ECU rack arranged in a vehicle. Thus, the ECU rack reduces or eliminates the need for filters for cleaning the intake cooling air before reaching the ECU rack.

With fluid is meant herein any suitable liquid or gas suitable for cooling the ECU rack. Preferably, the fluid is air.

With "fluid tight" of "fluidly seal" is to be understood that a sealing is formed which hinders the fluid from leaking through under circumstances relevant for an ECU rack in a vehicle. For example, when the cooling fluid is air in a cooling system, "fluid tight" or "fluidly seal" is to be understood as sealing against air at a pressure residing in said cooling system.

That the fluid tight enclosure of the ECU module is extending a length along a longitudinal axis implies that the fluid tight enclosure is fluid tight in planes perpendicular to the longitudinal axis, along said length.

In view of the above, the ECU rack is configured for providing a fluid flow from said fluid inlet arrangement to said fluid outlet arrangement via the intermediate spaces to cool the ECU modules. To this end, the ECU rack may be configured for sealingly receiving the enclosures of the ECU modules when the electronic connectors of the ECU modules are coupled to the electronic connector elements, so as to fluidly seal the intermediate spaces to enable a fluid flow from the fluid inlet arrangement to the fluid outlet arrangement.

Optionally, the fluid tight enclosure may be in the form of a sleeve, open towards at least one end where the electronic connector may be arranged.

Optionally, the fluid tight enclosure may be in the form of a sleeve open towards two opposite ends. The electronic connector may be arranged at one of the two ends.

Optionally, the ECU module may comprise a second electronic connector. The first connector may be arranged at one end of the ECU module, and the second connector may be arranged at another, opposite end of the ECU module.

When the fluid tight enclosure is in the form of a sleeve open towards two opposite ends of the ECU module, a first electronic connector may be arranged at one of the ends, and a second electronic connector may be arranged at the other one of the ends.

When the ECU module comprises a first and a second electronic connector, the housing of the ECU rack may comprise a plurality of first electronic connector elements and a plurality of second electronic connector elements, the first and second electronic connector elements being configured for receiving the first and second electronic connectors of the ECU modules, respectively. The ECU rack may be configured for sealingly receiving the enclosures of the ECU modules when the first electronic connectors of the ECU modules are coupled to the first electronic connector elements, and the second electronic connectors of the ECU modules are coupled to the second electronic connector elements, so as to fluidly seal the intermediate spaces from the first and second electronic connectors of the ECU modules when positioned in the ECU rack.

When the enclosure of the ECU module is open towards two ends, the ECU rack may be configured to sealingly receive both ends of the enclosure, so as to fluidly seal the intermediate spaces from the two open ends of the enclosure when the ECU modules are positioned in the ECU rack.

Optionally, the electronic connector(s) of the ECU module may be facing a plane perpendicular to the longitudinal axis.

Optionally, the rack is configured such that the intermediate spaces are separated from each other by the ECU module volumes.

Optionally, for at least one, preferably all of the intermediate spaces, the fluid inlet arrangement comprises an inlet to the intermediate space, and the fluid outlet arrangement comprises an outlet from the intermediate space. Hence, each intermediate space may form a cooling fluid duct when the ECU rack is in use.

Optionally, the inlet to and/or outlet from the intermediate space may be arranged to extend through a server holding member.

Optionally, the inlet to and/or outlet from the intermediate space may be arranged to extend between two adjacent server holding members.

Optionally, the housing comprises a back panel comprising the electronic connector elements.

Optionally, the housing comprises at least and two opposing side panels.

Optionally, the housing comprises a front panel, such as a front panel comprising a door openable to allow insertion/removal of the ECU modules to/from the ECU rack.

Optionally, the housing comprises a back panel comprising the electronic connector elements, a first set of two opposing side panels, a second set of two opposing side panels, and a front panel.

Optionally, the housing is generally rectangular.

Optionally, the fluid inlet arrangement and the fluid outlet arrangement are each arranged to one of the two opposing side panels of the housing.

Optionally, the side panels of the housing comprise the module holding members.

Optionally, each module holding member comprises two opposing holding elements.

Optionally, one holding element is arranged on each of the opposing side panels of the housing.

Optionally the holding members (or holding elements) are adapted to allow introduction of ECU modules to the rack by translational movement along a direction towards and away from, respectively, the electronic connector elements.

Optionally, the ECU rack comprises sealing members configured for sealingly receiving the enclosures of the ECU modules.

Optionally, each sealing member is arranged to surround an electronic connector element.

Optionally, each sealing member is arranged to surround an ECU module volume at a location of the fluid tight enclosure of an ECU module when present in the ECU module volume.

Optionally, a length of the ECU module volume as seen along a direction between the fluid inlet arrangement and the fluid outlet arrangement is greater than a width of the ECU module volume between two intermediate spaces.

The ECU modules may comprise two end surfaces, perpendicular to the longitudinal direction, a first set of opposing module side surfaces in planes parallel to the longitudinal direction, and a second set of opposing module side surfaces in planes parallel to the longitudinal directions. The first set of opposing module side surfaces may have a surface area greater than that of the second set of opposing module side surfaces. The intermediate spaces may be formed between side surfaces from the first set (the largest area) of neighbouring modules. Accordingly, an efficient cooling effect may be achieved by the cooling fluid flowing over the largest side surfaces of the ECU modules.

Optionally, the ECU rack may be comprising a plurality of ECU modules. The ECU modules may be removably arranged in the rack. The electronic connectors of the ECU modules may be removably coupled to the electronic connector elements of the ECU rack.

Optionally, the enclosure of each ECU module may be formed by a heat conductive material, such as a metal, for example aluminum.

With "heat conductive" is in this context meant a material being effective to transfer heat/cooling in the context of fluid cooling of an ECU rack. For example, the heat conductive material may be a material being more heat conductive than an inner material of the module, e.g. more heat conductive than a plastic material.

In a second aspect, the object is achieved by an ECU arrangement according to claim 15. Thus, there is provided an ECU arrangement in a vehicle comprising an ECU rack in accordance with the first aspect of the disclosure, wherein the fluid inlet arrangement is arranged in communication with inlet cooling fluid.

Optionally, the fluid inlet arrangement is configured for distributing the fluid to the intermediate spaces in a vertical direction; and the fluid outlet arrangement is configured for draining cooling fluid from the intermediate spaces in a vertical direction.

Thus, the fluid flow in the intermediate spaces will flow in a generally vertical direction, i.e. generally vertically upwards or downwards.

When the cooling fluid is air, condensed liquid (water) may form during its passage through the ECU rack. When the fluid flows in a generally vertical direction, the condensed liquid may fall vertically downwards and out of the rack rather than gathering on the ECU modules. The same applies for any dust or debris from the air.

Optionally, the ECU rack may be arranged such that the air inlet arrangement is directed in a vertically upward direction, and the air outlet arrangement is directed in a vertically downward direction.

Optionally, the ECU rack may be arranged such that the air inlet arrangement is directed in a vertically downward direction, and the air outlet arrangement is directed in a vertically upward direction.

In a third aspect, the object is achieved by a vehicle. Thus, there is provided a vehicle comprising an ECU rack in accordance with the first aspect or an ECU arrangement according to the second aspect.

In a fourth aspect, the object is achieved by an ECU module configured for an ECU rack according to the first aspect. Thus there is provided an ECU module comprising a fluid tight enclosure extending a length along a longitudinal axis of the ECU module and enclosing electronics of the ECU module at least along the length; and at least one electronic connector; the ECU module being configured to be sealingly received in an enclosure of an ECU rack according to the first aspect.

Optionally, the ECU module may comprise a sealing, arranged to the fluid tight enclosure. Optionally, the sealing may extend continuously around the electronic connector.

Features and advantages as described in relation to one of the aspects of the disclosure are equally applicable to the other aspects of the disclosure.

Further advantages and advantageous features of the invention are disclosed in the following description and in the dependent claims.

BRIEF DESCRIPTION OF THE DRAWINGS

With reference to the appended drawings, below follows a more detailed description of embodiments of the invention cited as examples.

In the drawings:

FIG. 2*b* is a perspective view of another variant of an ECU module for use with an ECU rack according to the present disclosure;

DETAILED DESCRIPTION

Figure 1:
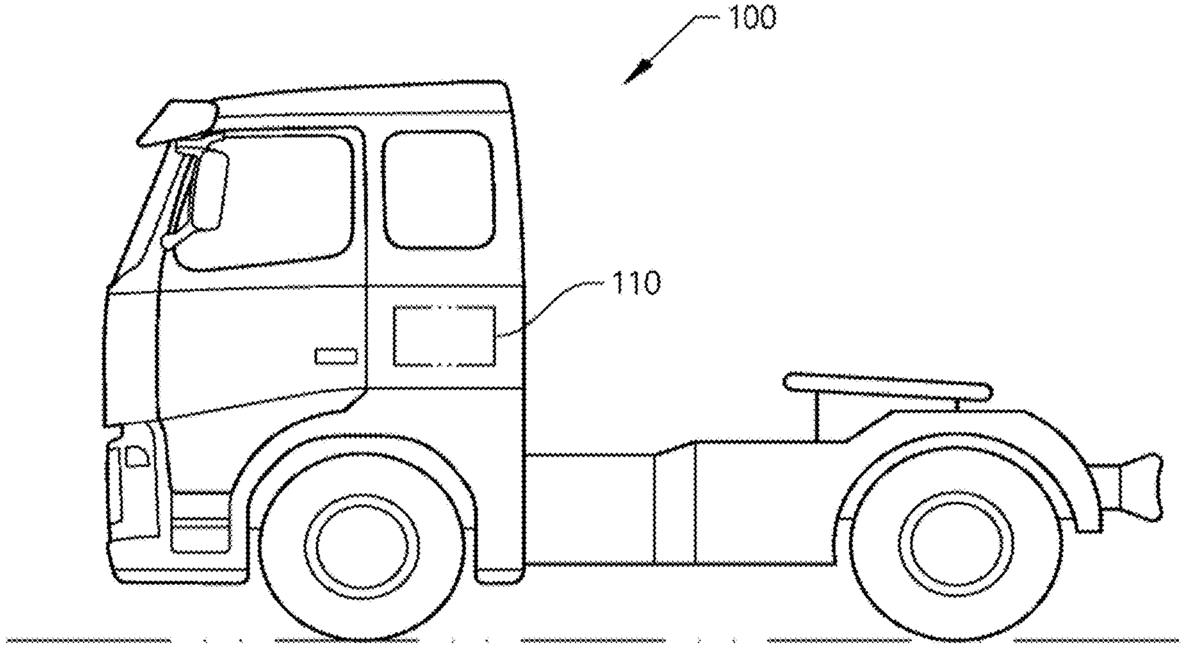
FIG. 1 schematically illustrates a vehicle housing a variant of an ECU rack according to the present disclosure.

FIG. 1 illustrates a vehicle 100 for which the ECU rack 1 and ECU arrangement 110 as described herein may be implemented. The illustrated vehicle 10 is a truck, but it is to be understood that the disclosure is not limited to trucks but encompass other vehicles such as e.g. personal cars or buses.

The disclosure relates to an ECU rack 1 for use in a vehicle, in particular a truck, configured for receiving a plurality of ECU modules 3.

Figure 2A:
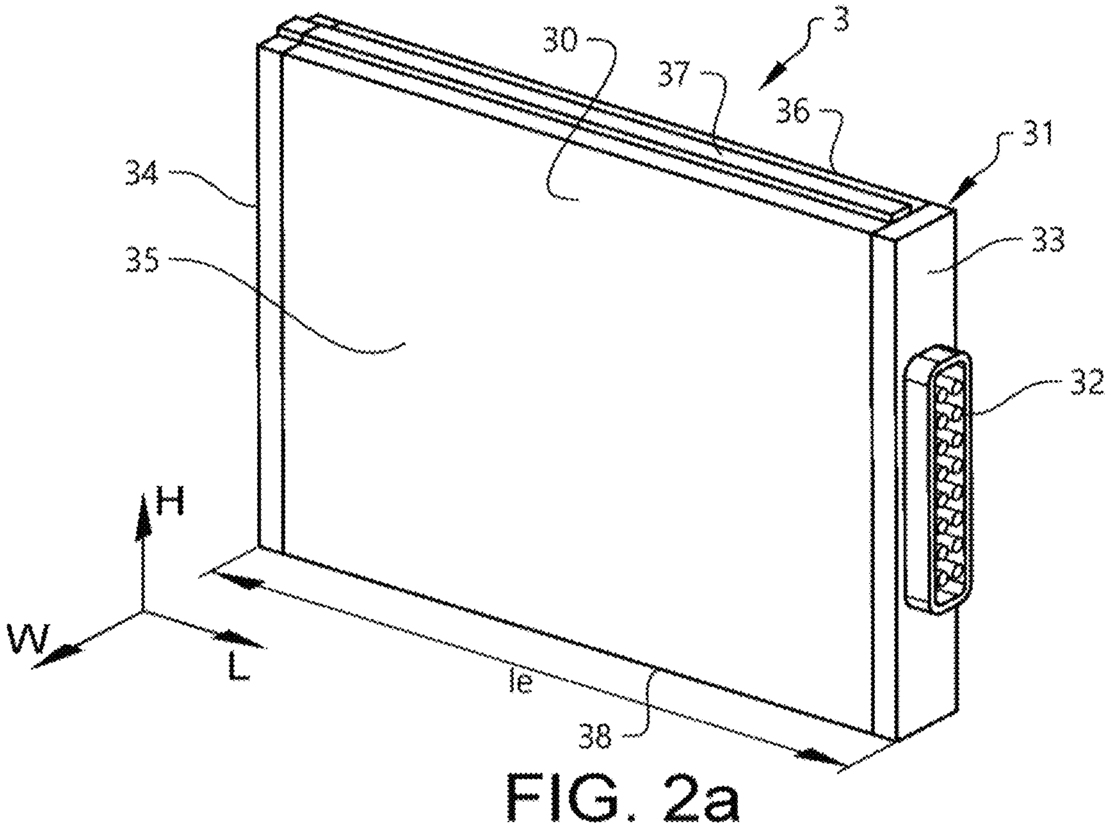
FIG. 2*a* is a perspective view of a variant of an ECU module for use with an ECU rack according to the present disclosure.
Figure 2A:
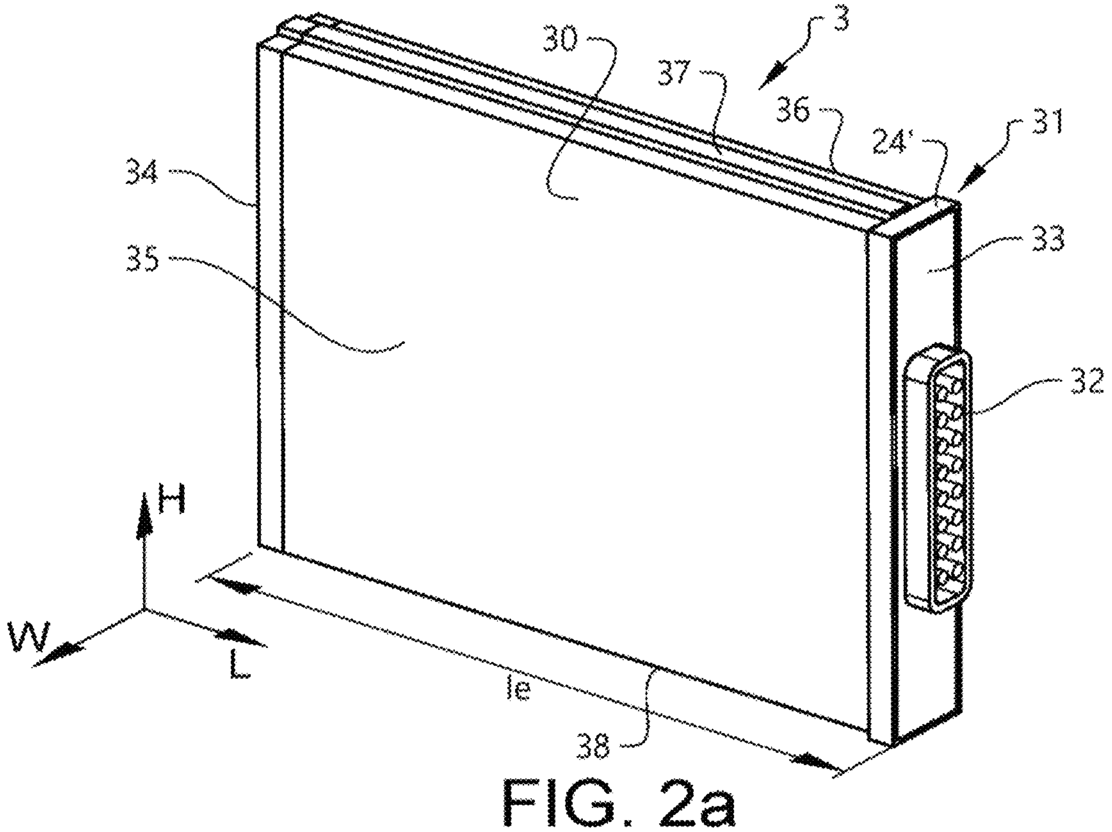

FIG. 2 is a perspective view of a variant of an ECU module for use with an ECU rack according to the present disclosure.

The ECU module 3 is configured to house electronics e.g. for processing data in a vehicle. To this end, the ECU module 3 may comprise a housing 31 in which the electronics is arranged, and one or more electronic connectors 32 for transferring power and/or data to/from the ECU module 3. The housing 31 may be made of any suitable material, for example plastic.

The ECU module 3 has a longitudinal extension along a length direction L, a height extension along a height direction H being perpendicular to said length direction L, and a width extension along a width direction W being perpendicular to said length direction L as well as to said height direction H. The ECU module 3 may have a generally rectangular shape.

As illustrated in FIGS. 2*a-b*, the ECU module 3 may comprise two end surfaces 33, 34 in planes generally perpendicular to the length axis L, a first set of opposing module side surfaces 35, 36 in planes parallel to the length axis L, and a second set of opposing module side surfaces 37, 38 in planes parallel to the length axis L.

The surface area of the first set of opposing module side surfaces 35, 36 may be greater than the surface area of the second set of opposing module side surfaces 37, 38. The surface area of the first set of opposing module side surfaces 35, 36 may also be greater than the surface area of the end surfaces 33, 34.

The ECU module 3 comprises a fluid tight enclosure 30 having an extension le along the length direction L of the ECU module 3 and enclosing the electronics of the ECU module 3 in directions perpendicular to the length axis L along its length le.

As in the ECU modules 3 of FIGS. 2*a-b*, the fluid tight enclosure 30 may extend over a majority of the total extension of the ECU module 3 along the length axis L, such as over at least 50% of the total extension of the ECU module 3, or over 80% of the total extension of the ECU module 3.

The fluid tight enclosure 30 may be formed by a heat conductive material such as a metal, for example aluminum.

The fluid tight enclosure 30 may form the outer wall as well as the inner wall of the ECU module 3, i.e. the housing 31 is constituted by the enclosure 30 over the length le of the enclosure 30.

Alternatively, the fluid tight enclosure 30 may be arranged to surround an inner housing 31, i.e. the fluid tight enclosure 30 may form an outer wall of the ECU module 3, arranged exterior of an inner wall of the housing 31.

Further, the ECU module 3 comprises at least one electronic connector 32 for receiving power and/or for transmitting/receiving data to/from the module 3.

The electronic connector 32 may be arranged at a longitudinal end surface 33 of the ECU module 3. As exemplified in FIG. 2*a*, the electronic connector 32 of the module 3 may be facing a plane perpendicular to the length axis L.

The fluid tight enclosure 30 may be in the form of a sleeve, which is open towards at least one end of the ECU module 3 where the electronic connector 32 is arranged.

The ECU module 3 illustrated in the drawings comprises one electronic connector 32. In other variants of the ECU module 3 the ECU module 3 may comprise additional electronics; e.g. an additional electronic connector. For example, an additional electronic connector may be arranged at the second end 34 of the ECU module 3. The fluid tight enclosure 32 may be in the form of a sleeve open towards the two opposite ends 33 and 34.

Figure 3A:
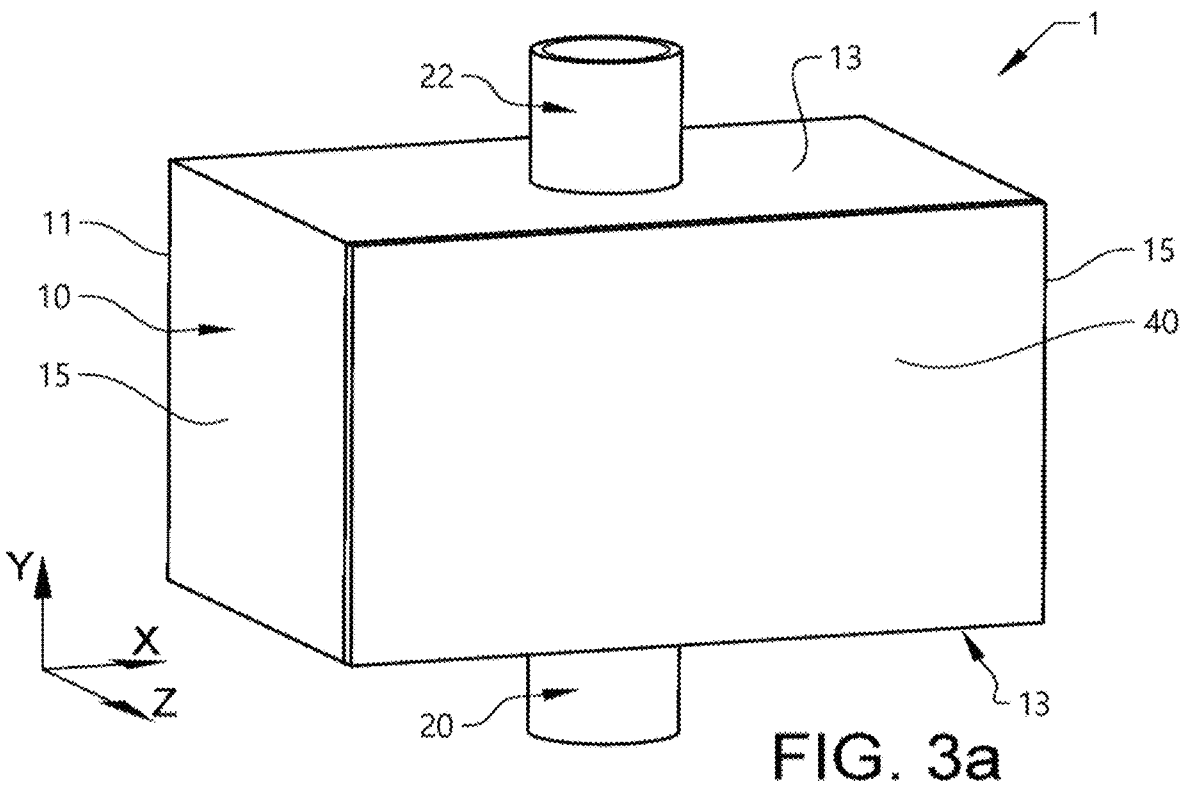
FIG. 3*a* is a perspective view from the front of a variant of an ECU rack when in a closed condition.
Figure 3B:
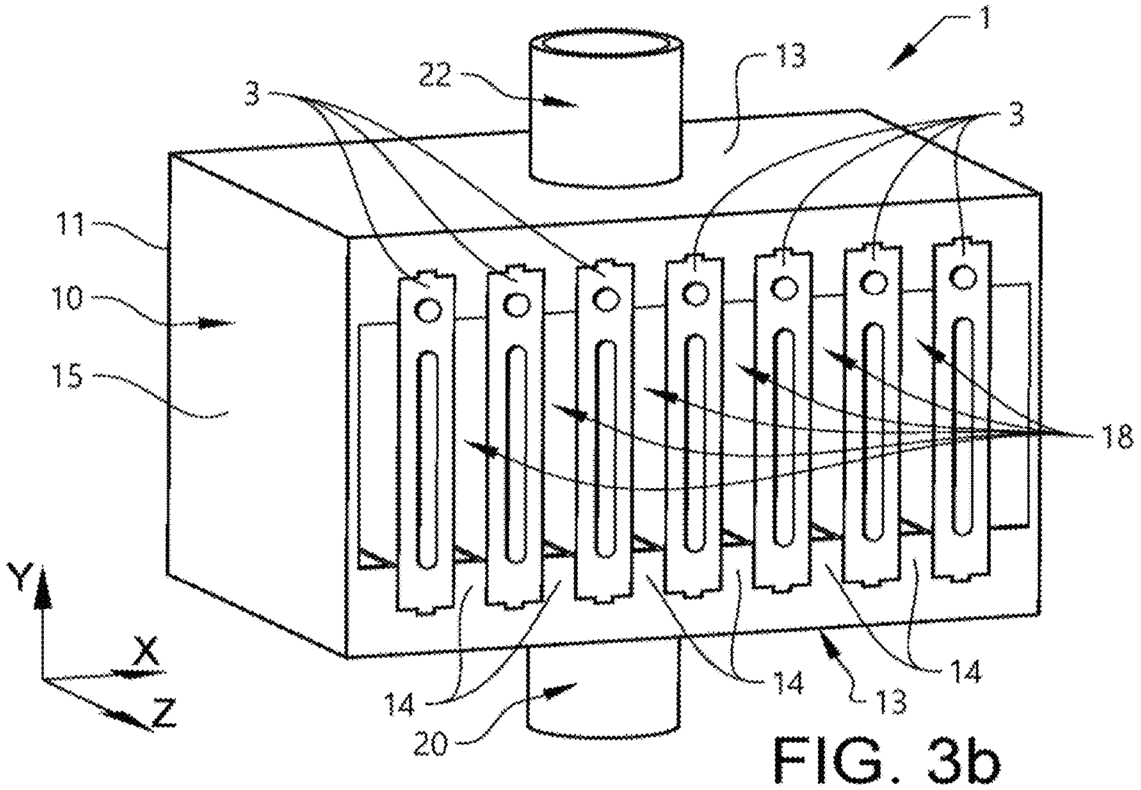
FIG. 3*b* is a perspective view from the front of the variant of an ECU rack of FIG. 3*a* when in an open condition, comprising a number of ECU modules of FIG. 2*a;*

FIG. 3*a* is a perspective view of a variant of an ECU rack according to the present disclosure when in a closed condition, and FIG. 3*b* is a perspective view of the same ECU rack when in an open condition, comprising a number of ECU modules 3.

The ECU rack 1 has a longitudinal extension along a longitudinal direction x, a vertical extension along a vertical direction y being perpendicular to said longitudinal direction, and a transversal extension along a transversal direction z being perpendicular to said longitudinal direction as well as to said vertical direction. The terms longitudinal, transversal and vertical are used with reference to the ECU rack only, and are not to correspond to any specific direction in space unless explicitly mentioned.

The ECU rack 1 comprises a housing 10 comprising a front panel 40, which is shown in a closed condition in FIG. 3*a*.

The ECU rack 1 may, as illustrated in FIG. 3*a* comprise a first pair of opposing side panels 13, and a second pair of opposing side panels 15. In the illustrated variant, the first pair of opposing side panels 13 form a top and a bottom panel as seen along the vertical direction y. Further, the ECU rack 1 comprises a back panel 11 opposing the front panel 40.

The ECU rack 1 further comprises a fluid inlet arrangement 20 and a fluid outlet arrangement 22, allowing a flow of cooling fluid through the ECU rack 1.

FIG. 3*b* illustrates the ECU rack 1 of FIG. 3*a* when in an open condition and comprising a plurality of ECU modules 3, such as described in relation to FIG. 2*a*. The ECU modules 3 are removably arranged in the ECU rack 1.

Figure 4:
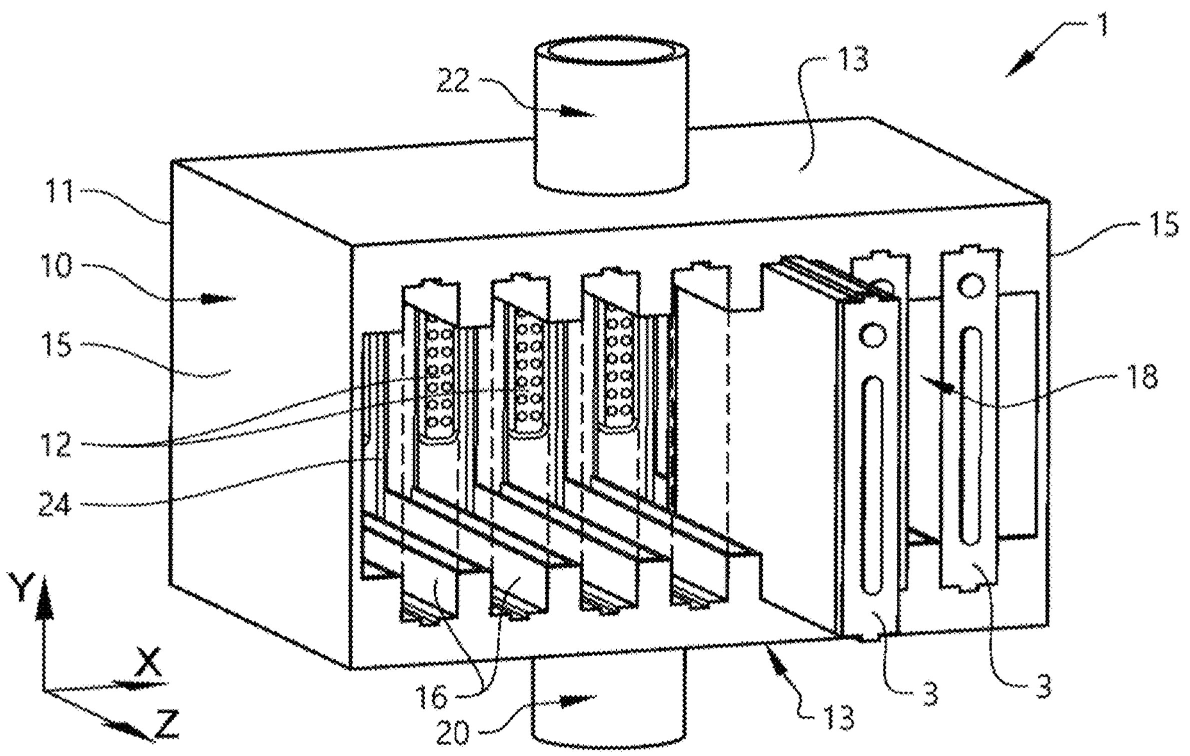
FIG. 4 is the same view of the ECU rack of FIG. 3, a but with only a few ECU modules inserted.

FIG. 4 illustrates the ECU rack 1 of FIGS. 3*a*-3*b* with some ECU modules 3 removed.

As exemplified in FIG. 4, the ECU modules 3 are arranged side by side along the longitudinal direction x. 1. The end surfaces 33 of the ECU modules 3 comprising the electronic connectors 32 are arranged towards the back panel 11 of the ECU rack 1, which comprises corresponding electric connector elements 12. The connectors 32 of the ECU modules 3 are removably coupled to the connector elements 12 of the ECU rack 1. As in the illustrated variant, the ECU modules 3 may be insertable to and removable from the ECU rack by translational motion along the transverse direction z.

The ECU rack 1 comprises module holding members 14 for holding the ECU modules 3 in position in the ECU rack 1. Each module holding member 14 is configured for holding an ECU module 3 in position in the ECU rack 1 with an electronic connector 32 of the ECU module 3 connected to a connector element 12 of the ECU rack 1. The module holding members 14 may be adapted to allow connection of the ECU modules 3 to the rack 1 by said translational movement along the transverse direction of the rack 1.

For example, as in the illustrated variant, the first pair of side panels 13 of the ECU rack may comprise the module holding members 14. Each module holding member 14 may comprise two opposing holding elements 15'. One holding element 15' may be arranged on each of the first pair of side panels 13.

The space within the ECU rack 1 which is designated to be occupied by an ECU module 3 when held by a holding member 14 in the ECU rack 1, is referred to herein as an ECU module volume 16. As seen in FIG. 4, the ECU module volumes 16 will be positioned in the ECU rack 1 just like the ECU modules 3, when present therein.

Further, the holding members 14 are arranged side by side along the longitudinal direction X so as to form intermediate spaces 18 between neighbouring ECU module volumes 16 as seen along the longitudinal direction x. Thus, when ECU modules 3 are positioned in the ECU rack 1, the intermediate spaces 18 will be formed between neighbouring ECU modules 3.

In accordance with the present disclosure, for cooling the ECU rack, cooling fluid is to flow through said intermediate spaces 18, so as to cool the adjacent ECU modules 3.

As illustrated in FIG. 4, the example ECU rack 1 is configured such that the intermediate spaces 18 are separated from each other by the ECU module volumes 16. The cooling fluid flow may hence flow immediately over the ECU modules 3 arranged in the ECU module volumes 16, which promotes heat transfer between the ECU modules 3 and the cooling fluid flow.

Thus, to conduct cooling fluid into the ECU rack 1, the ECU rack 1 further comprises a fluid inlet arrangement 20 configured for receiving fluid from an exterior of the rack 1 and for distributing the fluid to the intermediate spaces 18; and a fluid outlet arrangement 22 configured for draining cooling fluid from the intermediate spaces 18 to the exterior of the ECU rack 1.

When cooling fluid is introduced via the fluid inlet arrangement 20, cooling fluid will thus pass through the intermediate spaces 18, and out via the fluid outlet arrangement 22, cooling the ECU modules 3 by virtue of heat exchange with the fluid tight enclosures 30 of the ECU modules 3.

Figure 5:
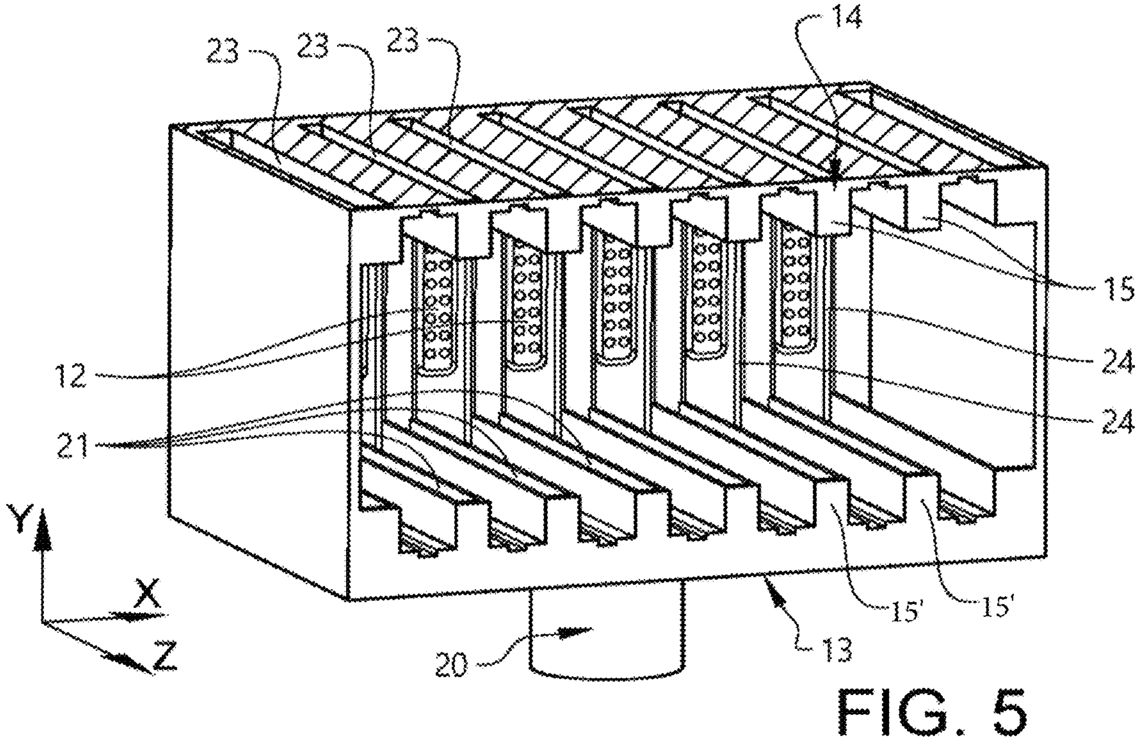
FIG. 5 is a perspective view of an inner portion of the ECU rack of FIG. 3*a;*
Figure 6:
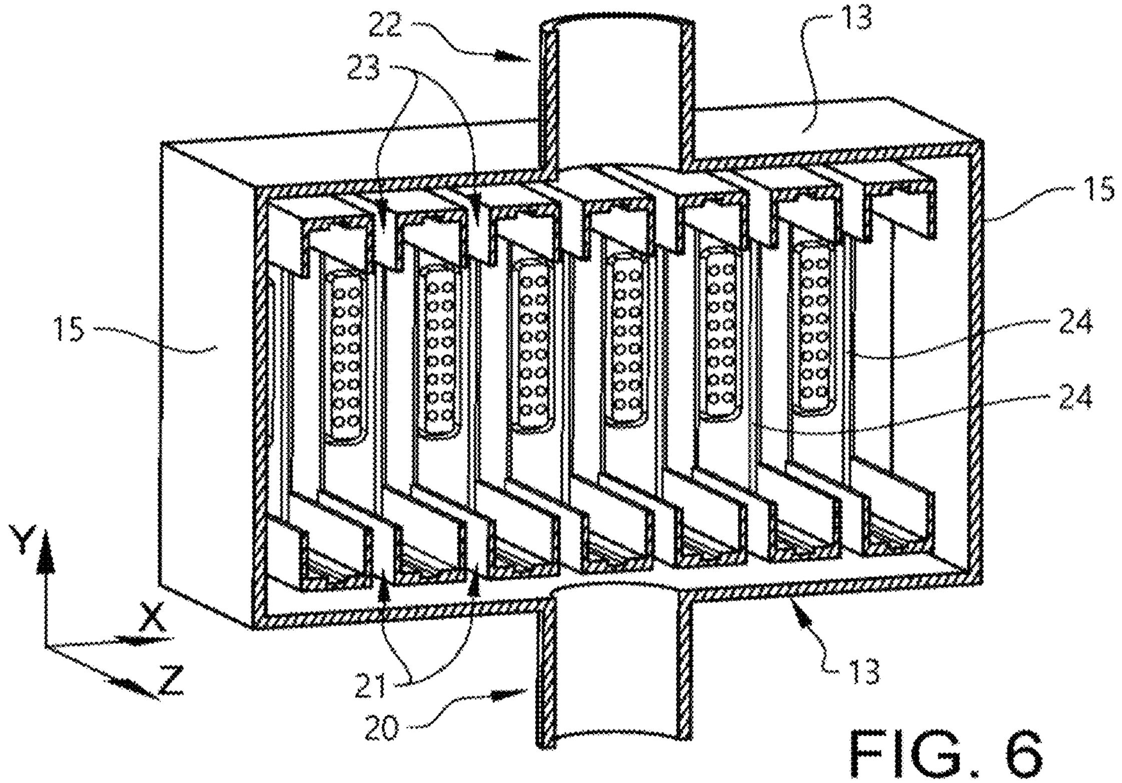
FIG. 6 is a perspective view of the ECU rack of FIG. 3*a*, as seen from a cut through a central xy-plane.
Figure 7:
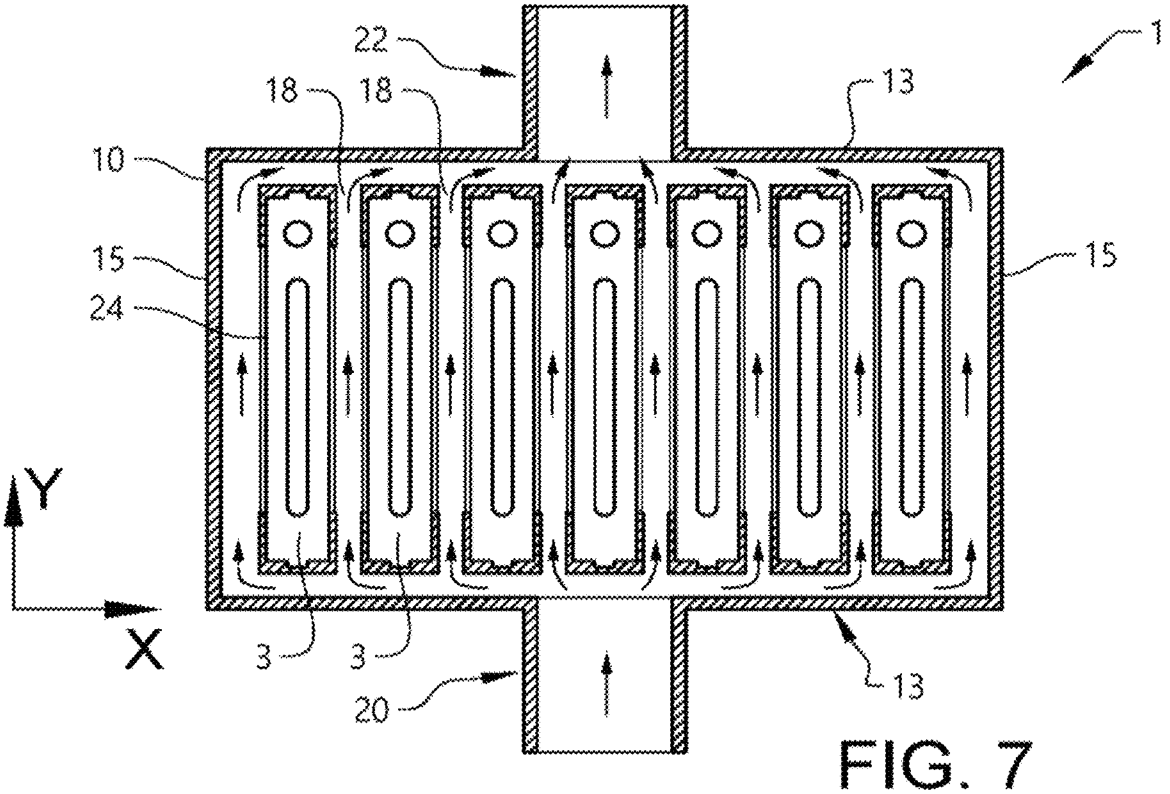
FIG. 7 is a cross-sectional view along a central transversal plane of the ECU rack of FIG. 3*a*, comprising ECU modules 3.

FIGS. 5 to 7 illustrate the fluid inlet arrangement 20 and the fluid outlet arrangement 22.

FIG. 5 illustrates an inner portion of the housing 10 of the ECU rack 1, showing inlets 21 to the intermediate spaces 18, and outlets 23 from the intermediate spaces 18. FIG. 6 is a cross-sectional view through the ECU rack 1, in which the full design of a variant of the fluid inlet arrangement 20 and the fluid outlet arrangement 22 is illustrated.

As illustrated in FIGS. 5 and 6, for all of the intermediate spaces 18 in the ECU rack 1, the fluid inlet arrangement 20 may comprise an inlet 21 to the intermediate space 18, and the fluid outlet arrangement 22 may comprise an outlet 23 from the intermediate space 18. Accordingly, a fluid flow through the intermediate spaces 18 along the vertical direction y of the fluid rack 1 may be accomplished.

As exemplified by the illustrated ECU rack 1, the inlets 21 and outlets 23 may be arranged to extend between the server holding members 14, as seen along the longitudinal direction x.

In the illustrated variant, the inlets 21 and outlets 23 are formed by elongate openings extending along the majority of the transversal direction z of the intermediate spaces 18. Many variants are possible, such as that the inlets 21 and/or outlets 23 are formed by a number of holes or slits.

FIG. 6 illustrates how the fluid inlet arrangement 20 may comprise a central inlet being in fluid communication with the inlets 21 for distribution of cooling fluid to the intermediate spaces 18. Similarly, the fluid outlet arrangement 22 may comprise a central outlet being in fluid communication with the outlets 23 for draining cooling fluid from the intermediate spaces 18.

FIG. 7 is a cross-section of the ECU rack 1 of the previous figures as seen in a transversal central plane. ECU modules 3 are illustrated as arranged in the ECU rack 1 in FIG. 7. The arrows indicate the direction of a cooling fluid flow, showing how cooling fluid may pass from the fluid inlet arrangement 20 to the fluid outlet arrangement 22 via the intermediate spaces 18.

As may be gleaned from FIG. 7, the ECU rack 1 may be adapted such that the intermediate spaces 18 are formed between the largest outer surfaces of neighbouring ECU modules 3, so as to provide the largest possible surface of the ECU modules 3 for cooling.

Further, the ECU rack 1 is configured for sealingly receiving the enclosures 30 when the electronic connectors 32 of the ECU modules 3 are coupled to the electronic connector elements 12, so as to fluidly seal the intermediate spaces 18 from the electronic connectors 32 of the ECU modules 3 when positioned in the ECU rack 1.

By fluidly sealing between the ECU rack and the fluid tight enclosures 30 of the ECU modules 3, it may be ensured that the cooling fluid will be hindered from reaching the electronic connectors 32 of the ECU modules 3 when positioned in the ECU rack 1.

The flowing cooling fluid will thus be confined to the intermediate spaces 18 between the fluid tight enclosures 30, meaning that sensitivity of the ECU rack to debris or other impurities in the cooling fluid will be diminished.

As illustrated in the variant of an ECU rack 1 shown in the figures, the ECU rack 1 may comprise sealing members 24 configured for sealingly receiving the enclosures 30 of the ECU modules 3. Thus, the sealing members 24 contribute to forming a fluid tight seal towards the fluid tight enclosures of the ECU modules 3, ensuring that the flow of cooling fluid in the intermediate spaces 18 is hindered from reaching the electronic connectors 32 of the ECU modules 3 and the electronic connector elements 12 of the ECU rack 1.

Figure 8:
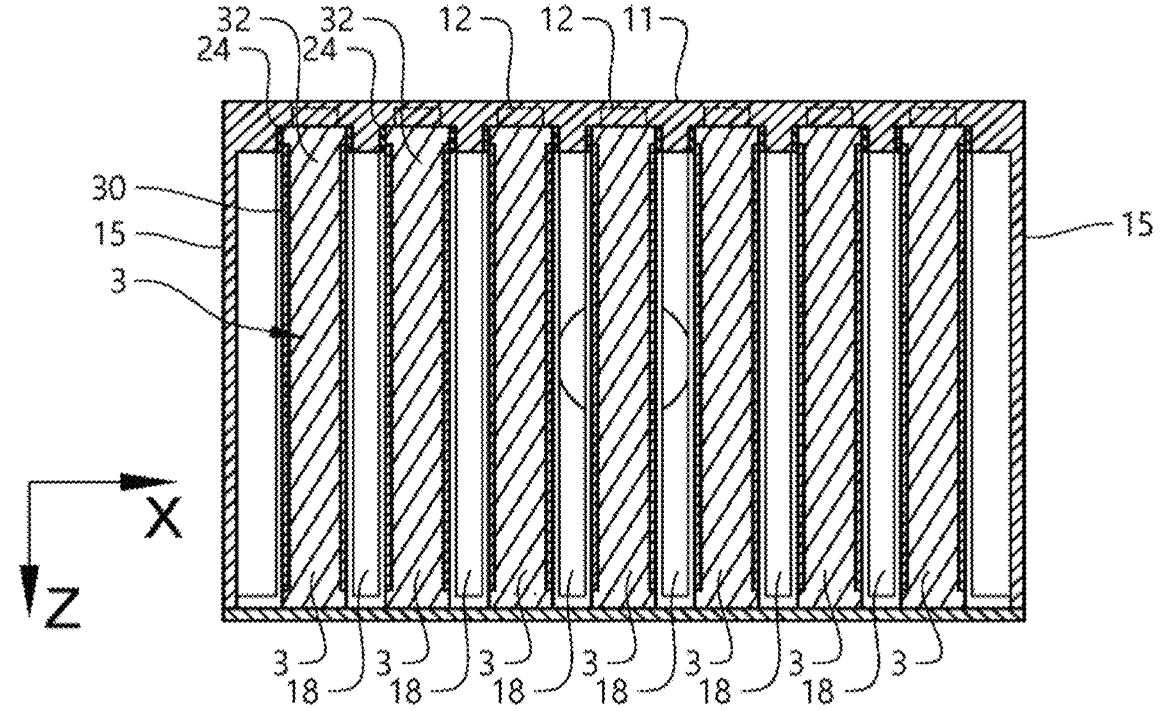
FIG. 8 is a cross-sectional view along a vertical plane of the ECU rack of FIG. 3*a*, comprising ECU modules 3.
Figure 9:
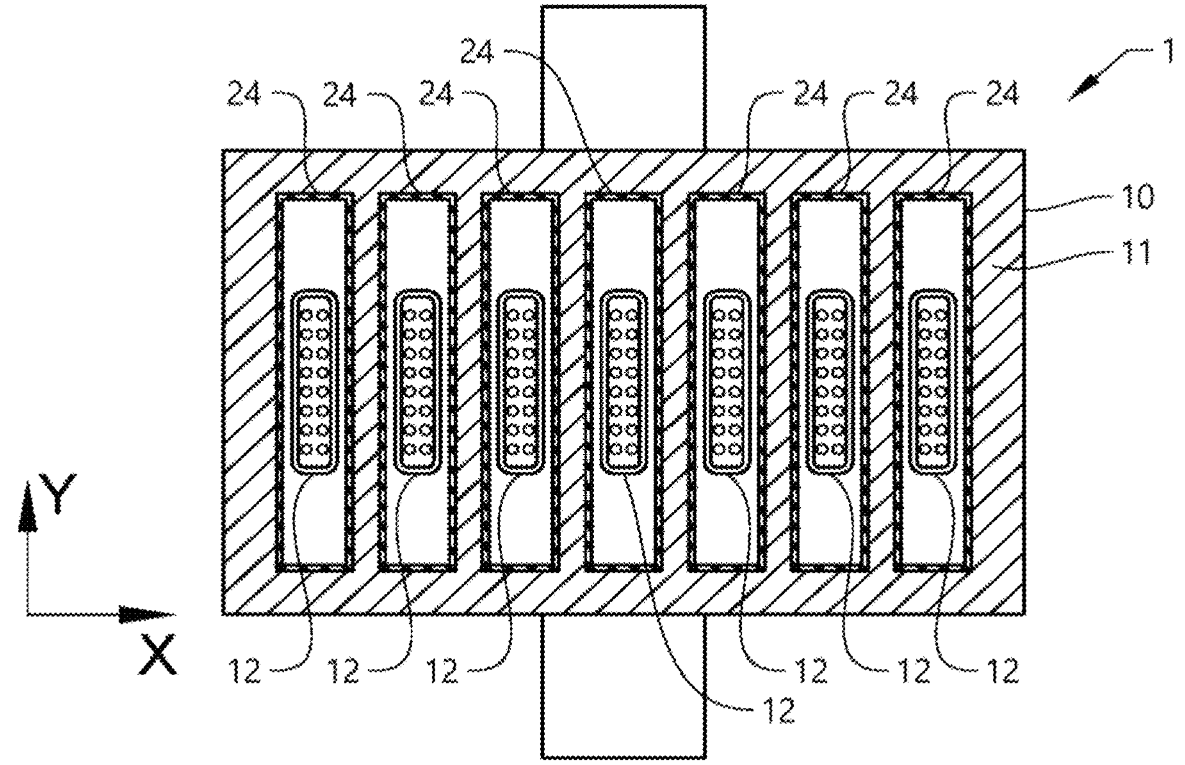
FIG. 9 illustrates a back panel of the ECU rack of FIG. 3*a*.

FIGS. 8 and 9 provide views of the location and position of the sealing members 24 in the illustrated variant of the ECU rack 1.

FIG. 8 is a cross-sectional view of the ECU rack 1 as seen in a vertical plane, when ECU modules 3 are arranged in the rack 1. FIG. 9 illustrates the back panel 11 of the housing 10 of the ECU rack 11.

As seen in FIG. 9, the back panel 11 comprises electronic connector elements 12 to which the electronic connectors 32 of the ECU modules 3 are to be connected. As illustrated, for each electronic connector element 12, a sealing member 24 may be arranged so as to surround the electronic connector element 12.

As may be seen in the example of FIG. 8, the sealing members 24 may be configured so as to seal towards the fluid tight enclosure 30 of the ECU modules 3. Thus, a fluid tight seal is accomplished between the fluid tight enclosure 30 and the ECU rack 1, ensuring that the cooling fluid is hindered from reaching the electronic connectors 32 and the electronic connector elements 12 when interconnected.

The sealing members 24 in the ECU rack 1 may be adapted to the ECU modules 3 to be inserted into the ECU rack, such that each sealing member 24 is arranged in relation to an ECU module volume 16, such that it will surround the ECU module volume 16 at a location where the fluid tight enclosure 30 will be positioned when present in the ECU module volume.

Thus, the ECU rack 1 is configured such that essentially only the fluid tight enclosures 30 of the ECU modules 3 will be in contact with the cooling fluid flow.

The configuration and location of the sealing members 24 may be varied depending on the configuration e.g. of the holding members 14 and the position of the electronic connector elements 12.

Also, the configuration and location of the sealing members 24 may be varied depending on the configuration of the ECU modules 3 to be inserted into the ECU rack 1.

For example, when the ECU module 3 is an ECU module 3 comprising a fluid tight enclosure which is open towards two end surfaces 33, 34, as mentioned in the above, the ECU rack 1 may be configured to sealingly receive the enclosure 30 adjacent both end surfaces 33, 34, so as to fluidly seal the intermediate spaces from the two open ends of the enclosure when the ECU modules 3 are positioned in the ECU rack 1.

When the ECU rack 1 is arranged in an ECU arrangement 110 in a vehicle 100 (see FIG. 1), the fluid inlet arrangement 20 of the ECU rack may be arranged in communication with inlet cooling fluid, e.g. in communication with an air inlet (not shown) of the vehicle. The air inlet may be arranged to receive air from the outside of the vehicle 100 or from the inside of the vehicle 100, e.g. from the driver's cabin.

The ECU rack 1 may for example be arranged in communication with inlet cooling fluid via an inlet conduit being without any filters for removing contaminants in the air such as dust or salt. Thus, the ECU rack 1 may be arranged in communication with inlet cooling fluid via an inlet conduit without any filters requiring regular replacement and/or cleaning.

The fluid outlet arrangement 22 of the ECU rack 1 may be in communication with an air outlet of the vehicle 100.

The fluid inlet arrangement 20 may be configured for distributing the fluid to the intermediate spaces 18 in a vertical direction, i.e. the direction of the fluid flow through the intermediate spaces 18 has a component in the vertical direction, preferably the direction of the fluid flow through the intermediate spaces 18 is a generally vertical direction. As illustrated in FIG. 7, this corresponds to the vertical direction y of the ECU rack 1 being aligned with a true vertical direction, and the longitudinal direction x and transversal direction z being in a horizontal plane.

The ECU rack 1 may hence be configured such that the intermediate spaces 18 formed between the server volumes 16 extend along the vertical direction from the fluid inlet arrangement 20 to the fluid outlet arrangement 22.

When the fluid flow is directed in a generally vertical direction past the ECU modules 3, this means that any debris introduced to the ECU rack 1 via the cooling fluid may fall vertically out of the ECU rack 1 rather than gathering on the ECU modules 3. When the cooling fluid is air, water contained in the air will tend to condense inside the ECU rack 1 during the cooling thereof. Also condensed liquid from the cooling air will be able to fall vertically out from the rack rather than gathering on the ECU modules 3.

The ECU rack 1 may be arranged such that the fluid flow through the intermediate spaces 18 is in a generally upward direction, such that gravity counteracts the tendency of debris in the fluid flow to follow the flow into the ECU rack 1.

However, although the vertical arrangements as set out in the above may be advantageous, other arrangements are also possible.

In the figures and in the above description, the ECU rack 1 is described in an example where the ECU rack 1 comprises seals 24 such that the ECU rack 1 is configured for sealingly receiving the enclosures 30 of the ECU modules 3 when the electronic connectors 32 of the ECU modules 3 are coupled to the electronic connector elements 12.

However, variants are possible where for example the ECU modules 3 are provided with seals 24' so as to ensure that the ECU modules 3 may be sealingly received in the ECU rack 1. FIG. 2*b* illustrates a variant of an ECU module 3 comprising a sealing 24'. The sealing 24' surrounds the electric connector 32 and is in contact with the enclosure 30 of the ECU module 3.

AN ECU rack 1 may be configured for sealingly receiving the ECU module of FIG. 2*b*. To this end, the ECU rack 1 may optionally comprise additional seals 24, complementing the seal 24' of the ECU module 3.

Other options and alternatives will be available to the person skilled in the art.

The invention claimed is:

1. Electronic control unit (ECU) rack for use in a vehicle, configured for receiving a plurality of ECU modules, each ECU module comprising a fluid tight enclosure extending a length along a longitudinal axis of said ECU module and enclosing electronics of said ECU module at least along said length; and at least one electronic connector;

said ECU rack comprising a housing comprising a plurality of electronic connector elements and a plurality of module holding members, each module holding member being configured for holding an ECU module in position in a corresponding ECU module volume with an electronic connector of said ECU module connected to an electronic connector element of said ECU rack;

said holding members being arranged side by side so as to form intermediate spaces between neighbouring ECU module volumes wherein said ECU rack comprises a fluid inlet arrangement configured for receiving a cooling fluid from an exterior of said ECU rack and for distributing said cooling fluid to said intermediate spaces; and a fluid outlet arrangement configured for draining said cooling fluid from said intermediate spaces to the exterior of said ECU rack;

wherein the ECU rack is configured for sealingly receiving said fluid tight enclosures when said at least one electronic connectors of said plurality of ECU modules are coupled to said plurality of electronic connector elements, so as to fluidly seal said intermediate spaces from said at least one electronic connectors of said plurality of ECU modules when positioned in the ECU rack, wherein said housing comprises a back side panel comprising said plurality of electronic connector elements, and two opposing side panels, wherein said two opposing side panels comprises said plurality of module holding members, wherein for at least one of said intermediate spaces, said fluid inlet arrangement comprises an inlet to said at least one of said intermediate spaces, and said fluid outlet arrangement comprises an outlet from said at least one of said intermediate spaces, and wherein said inlet to and/or outlet from said at least one of said intermediate spaces extends through said module holding member for a neighbouring ECU module.

2. ECU rack according to claim 1, wherein said ECU rack is configured such that said intermediate spaces are separated from each other by said ECU module volumes.

3. ECU rack according to claim 1, wherein said fluid inlet arrangement and said fluid outlet arrangement are each arranged to one of said two opposing side panels.

4. ECU rack according to claim 1, wherein each module holding member comprises two opposing holding elements.

5. ECU rack according to claim 4, wherein one of the two opposing holding element is arranged on each of said one of the two opposing side panels of said housing.

6. ECU rack according to claim 1, wherein said ECU rack comprises sealing members configured for sealingly receiving said fluid tight enclosures of said plurality of ECU modules.

7. ECU rack according to claim 6, wherein each sealing member is arranged to surround a respective electronic connector element of the plurality of electronic connector elements.

8. ECU rack according to claim 6, wherein each sealing member is arranged to surround the corresponding ECU module volume at a location of the fluid tight enclosure of said ECU module when present in said ECU module volume.

9. ECU rack according to claim 1, wherein a length of said ECU module volume as seen along a direction between said fluid inlet arrangement and said fluid outlet arrangement is greater than a length of said ECU module volume between two intermediate spaces.

10. ECU rack according to claim 1, comprising the plurality of ECU modules.

11. ECU rack according to claim 10, wherein said fluid tight enclosure of each ECU module is formed by a heat conductive material.

12. ECU arrangement in a vehicle comprising the ECU rack in accordance with claim 1, wherein said fluid inlet arrangement is arranged in communication with said cooling fluid.

13. ECU arrangement according to claim 12, wherein said fluid inlet arrangement is configured for distributing said cooling fluid to said intermediate spaces in a vertical direction; and said fluid outlet arrangement is configured for draining said cooling fluid from said intermediate spaces in a vertical direction.

14. A vehicle comprising the ECU rack in accordance with claim 1.

15. ECU module comprising a fluid tight enclosure extending a length along a longitudinal axis of said ECU module and enclosing electronics of said ECU module at least along said length; and at least one electronic connector; said ECU module being configured to be sealingly received in an housing of the ECU rack according to claim 1.

16. ECU module according to claim 15 comprising a sealing, arranged to said fluid tight enclosure, the sealing preferably extending continuously around said electronic connector.

* * * * *